(12) United States Patent
Hirose et al.

(10) Patent No.: US 7,456,763 B2
(45) Date of Patent: Nov. 25, 2008

(54) SEMICONDUCTOR DEVICE HAVING AN A/D CONVERSION CIRCUIT

(75) Inventors: Masaya Hirose, Kyoto (JP); Kinya Daio, Kyoto (JP); Tetsuya Oosaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/648,626

(22) Filed: Jan. 3, 2007

(65) Prior Publication Data

US 2007/0164890 A1 Jul. 19, 2007

(30) Foreign Application Priority Data

Jan. 19, 2006 (JP) ............... 2006-010681

(51) Int. Cl.
*H03M 1/10* (2006.01)
(52) U.S. Cl. ...................... 341/120; 341/155
(58) Field of Classification Search .......... 341/120–155
See application file for complete search history.

(56) References Cited

U.S. PATENT DOCUMENTS

| 6,331,770 | B1 * | 12/2001 | Sugamori | 341/120 |
| 7,015,685 | B2 * | 3/2006 | Nakayama | 324/158.1 |
| 7,154,427 | B2 * | 12/2006 | Matsui et al. | 341/161 |
| 2006/0012498 | A1 | 1/2006 | Shim et al. | |

FOREIGN PATENT DOCUMENTS

| JP | 63-310058 | 12/1988 |
| JP | 3-75976 | 3/1991 |
| JP | 6-162224 | 6/1994 |
| JP | 9-181604 | 7/1997 |
| JP | 2000-196451 | 7/2000 |
| JP | 2002-181865 | 6/2002 |
| JP | 2002-246909 A | 8/2002 |

OTHER PUBLICATIONS

Japanese Office Action, with English translation, issued in Japanese Patent Application No. JP 2006-010681, mailed Jun. 3, 2008.

* cited by examiner

*Primary Examiner*—Lam T Mai
(74) *Attorney, Agent, or Firm*—McDermott Will & Emery LLP

(57) ABSTRACT

The semiconductor device includes: an A/D conversion circuit; a digital processing circuit for performing processing based on conversion results of the A/D conversion circuit; and an output terminal for testing for outputting the conversion results of the A/D conversion circuit externally. The output of the conversion results from the output terminal for testing is made at timing that is different from timing of other conversion operation of which conversion results are to be outputted later and is longer in cycle than timing of conversion operation.

17 Claims, 6 Drawing Sheets

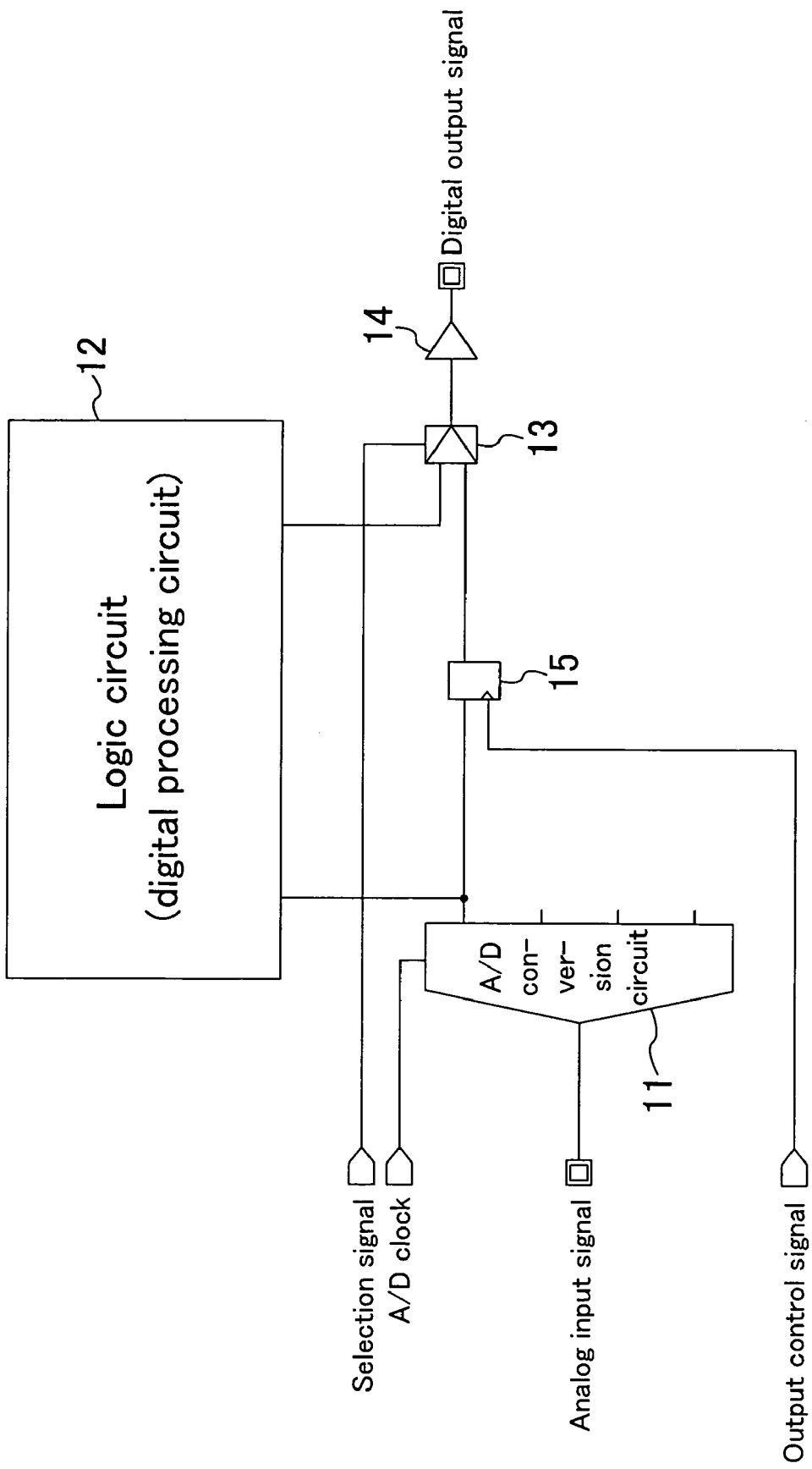

SEMICONDUCTOR DEVICE HAVING AN A/D CONVERSION CIRCUIT

BACKGROUND OF THE INVENTION

1. Field of the Invention

The present invention relates to a semiconductor device having an A/D conversion circuit, and more particularly to a semiconductor device that outputs conversion results of the A/D conversion circuit externally to enable testing of the A/D conversion circuit.

2. Description of the Prior Art

In recent years, semiconductor devices called system-on-chips, in which an A/D conversion circuit, a digital circuit for performing processing based on the conversion results and the like are mounted on one chip, have increasingly become mainstream. In some of such semiconductor devices having an A/D conversion circuit, a mode switch circuit is embedded so that A/D conversion results can be directly outputted externally via a digital buffer, to thereby allow separate testing of the A/D conversion circuit.

During the testing, however, a variation in power supply voltage and noise may occur because the digital buffer drives a comparatively large load testing apparatus (LSI tester). If influences of such a variation and noise become great, the A/D conversion precision may be degraded even though high-precision A/D conversion can be performed in actual use of the semiconductor devices, and thus proper testing may not be obtained.

To deal with the above problem, a technology is proposed in which a digital signal outputted from an A/D conversion circuit is converted to an analog signal of which level is slowly changed and the resultant signal is outputted via an analog buffer, thereby reducing the influences of a variation in power supply voltage and noise to improve the testing precision (see Japanese Laid-Open Patent Publication No. 2002-246909, for example)

However, the conventional semiconductor device described above has the following problems. Even though a digital signal is converted to an analog signal of which level is slowly changed, the influences of a variation in power supply voltage and noise will not necessarily be eliminated as long as a level shift occurs, depending on the relationship thereof with the magnitude of the load of the testing apparatus and the like. Moreover, the use of an analog buffer will cause an increase in circuit scale.

SUMMARY OF THE INVENTION

An object of the present invention is providing a semiconductor device that can avoid influences of a variation in power supply voltage and noise occurring at the time of output of A/D conversion results to permit proper testing of an A/D conversion circuit to be performed easily, and also can reduce the circuit scale by adopting a simple configuration.

The semiconductor device of the present invention includes:

an A/D conversion circuit;

a digital processing circuit for performing processing based on conversion results of the A/D conversion circuit; and an output terminal for testing for outputting the conversion results of the A/D conversion circuit externally, wherein the output of the conversion results from the output terminal for testing is made at timing that is different from timing of other conversion operation of which conversion results are to be outputted later and is longer in cycle than timing of conversion operation.

The semiconductor device of the present invention includes:

an A/D conversion circuit for performing A/D conversion every clock cycle of an operation clock signal;

a digital processing circuit for performing processing based on conversion results of the A/D conversion circuit; and an output terminal for testing for outputting the conversion results of the A/D conversion circuit externally, wherein the device further comprises an output suppression circuit for suppressing output of the conversion results to the output terminal for testing at predetermined timing.

By controlling the output timing of the conversion results during testing of the A/D conversion circuit as described above, conversion results converted at timing at which no conversion results are outputted are free from influences of noise and the like occurring with output of the conversion results. Thus, high-precision conversion results can be easily obtained with a simple configuration.

In the case of controlling the output timing of the conversion results with an external timing control signal, also, substantially the same control can be given easily, and thus high-precision conversion results can be obtained.

BRIEF DESCRIPTION OF THE DRAWINGS

FIG. 6 is a circuit diagram showing a configuration of a main portion of a semiconductor device of Embodiment 3.

DESCRIPTION OF THE PREFERRED EMBODIMENTS

Figure 1:
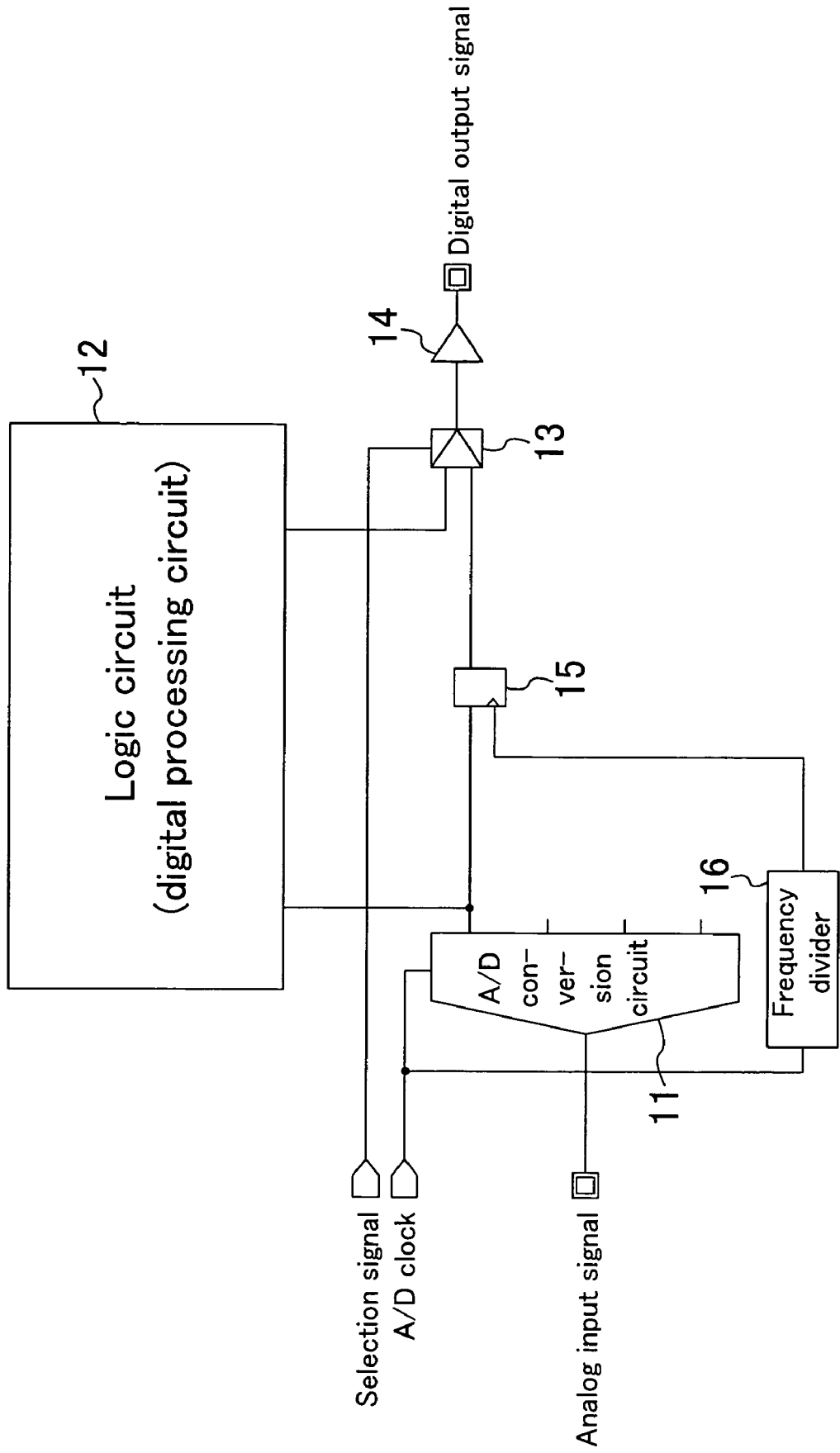
FIG. 1 is a circuit diagram showing a configuration of a main portion of a semiconductor device of Embodiment 1.

Hereinafter, preferred embodiments of the present invention will be described in detail with reference to the accompanying drawings. Note that in these embodiments, components having substantially the same functions are denoted by the same reference numerals, and the description thereof will not be repeated.

Embodiment 1

As shown in FIG. 1, a semiconductor device of Embodiment 1 includes an A/D conversion circuit 11 and a digital processing circuit 12.

The A/D conversion circuit 11 converts an analog input signal received from outside the semiconductor device, for example, into a 4-bit digital signal every clock cycle of an A/D conversion clock supplied inside or outside the semiconductor device.

The digital processing circuit 12 performs predetermined processing using conversion results of the A/D conversion circuit 11 (in FIG. 1, only one-bit output of the A/D conversion circuit 11 is representatively shown). A signal from the digital processing circuit 12 is output outside the semiconductor device via a selector 13, a buffer 14 and an external output terminal (output terminal for normal operation and output terminal for testing) as a digital output signal.

The conversion results of the A/D conversion circuit 11 are also input into a flipflop 15 to be held therein and then sent to the selector 13. The hold operation of the flipflop 15 is made in synchronization with a frequency-divided clock obtained from the A/D conversion clock being frequency-divided by two by a frequency divider 16.

In the semiconductor device having the configuration described above, during normal operation, the selector 13 selects the output of the digital processing circuit 12 according a selection signal, and thus results of the predetermined processing by the digital processing circuit 12 are outputted outside the semiconductor device.

During testing of the semiconductor device, a predetermined voltage is supplied as the analog input signal from outside the semiconductor device, and the selector 13 selects the output of the flipflop 15 according to the selection signal. Thus, the conversion results of the A/D conversion circuit 11, held in the flipflop 15, are outputted outside the semiconductor device. In this way, the conversion results can be checked by a testing apparatus not shown.

Figure 2:
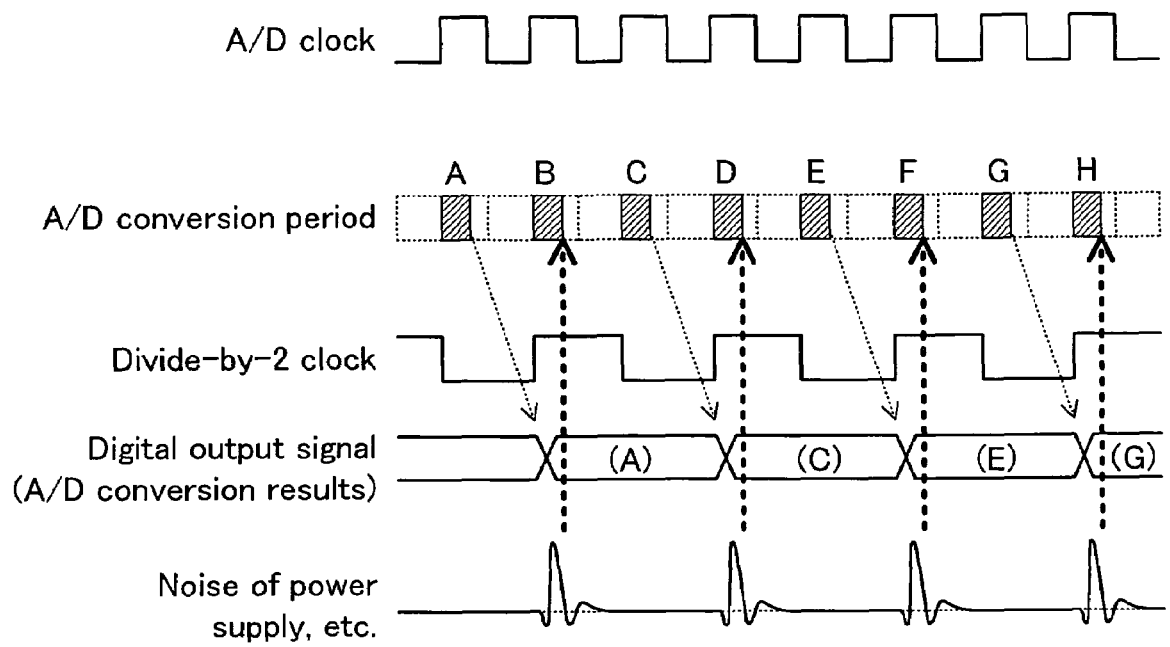
FIG. 2 is a timing chart showing the operation of the semiconductor device of Embodiment 1 during testing.

The hold operation of the flipflop 15 of holding the conversion results will be described in detail. The A/D conversion circuit 11 performs A/D conversion during each of periods A to H shown by hatching in FIG. 2 in synchronization with the rising timing of the A/D clock. However, since the flipflop 15 holds the conversion results at the rising timing of the divide-by-2 clock from the frequency divider 16, only the conversion results during the periods A, C, E and G are held and output via the selector 13 and the buffer 14. In this case, the actual A/D conversion rate at which the conversion results are outputted is ½, but this does not especially causes a problem in testing of the A/D conversion precision and the like.

At the timing of performing the above hold and output operation, a comparatively large load of a testing apparatus or the like (for example, about ten times that of the digital processing circuit 12) will be driven with the buffer 14. Therefore, compared with driving during normal operation, a variation in power supply voltage, superimposition of noise on the analog input signal via a parasitic capacitance existing inside/outside the semiconductor device and the like will be great. However, influences of such noise and the like will arise only at the timing of conversion during the periods B, D, F and H. The hold and output operation is suppressed at the timing of conversion during the periods A, C, E and G, and thus the conversion during these periods will not be influenced by such noise and the like. Thus, high-precision A/D conversion results can be obtained easily.

As described above, by suppressing output of part of the A/D conversion results and setting the output timing of the remaining conversion results to be outputted to have a longer cycle than the timing of the A/D conversion operation, the output timing can be easily differentiated from the conversion operation timing. In this way, even in the case that the output result is composed of a lot of bits making the same level shift, for example, it is possible to easily prevent degradation of the conversion precision caused by driving of a large load of a testing apparatus and the like.

In the suppression of part of output of the conversion results described above, the conversion operation for the part of conversion results that are not outputted may be omitted, or the timing may be shifted. In general, however, continuous conversion operation at the same timing as that during normal operation of the semiconductor device is preferred because with this operation proper testing results can be easily obtained.

The A/D clock is not necessarily frequency-divided by two, but may be divided by three or more depending on the time for which the influence of noise lasts and the like, for example. The frequency division ratio may be made programmably changeable. To suppress output of part of the conversion results, any means other than frequency-dividing the A/D clock as described above may be adopted, such as masking clock pulses partially to thin the pulses.

Figure 3:
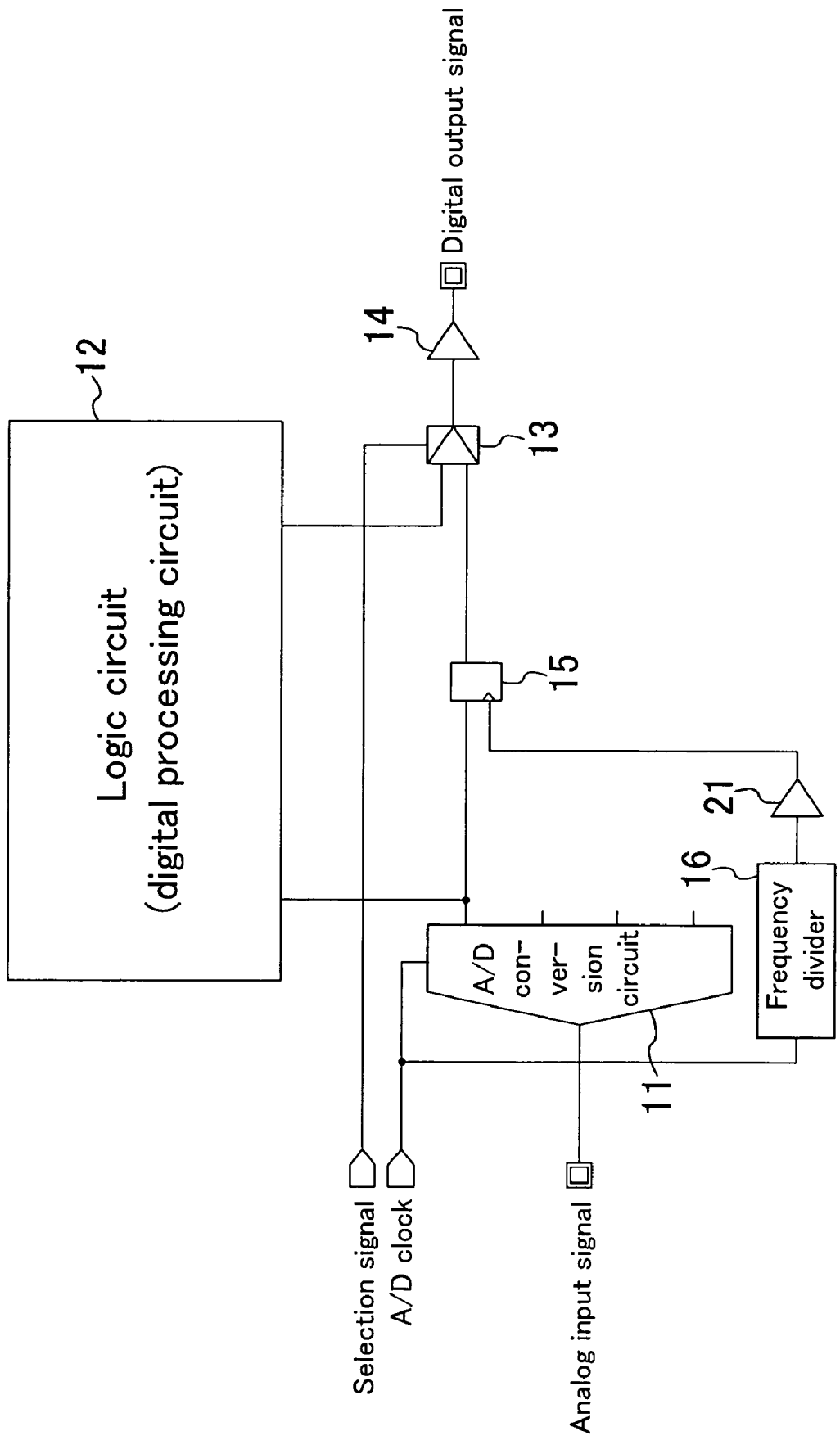
FIG. 3 is a circuit diagram of an alteration of Embodiment 1.

The output timing of the conversion results is not limited to the timing of rising edge of the divide-by-2 clock of the A/D clock, but may be timing delayed by a predetermined time (time in a predetermined proportion of the cycle of the A/D clock) given by a delay element 21 placed downstream (and/or upstream) of the frequency divider 16 as shown in FIG. 3, for example. That is, the output timing of the conversion results (more specifically, the period for which the influence of this output exceeds an allowable degree) may just be shifted from both or one of the timing at which the input voltage is held in a sample-and-hold circuit of the A/D conversion circuit 11 and the timing at which comparison operation by a comparison circuit is completed.

The output terminal for digital output signals is used both for the output of the A/D conversion results and the output of the digital processing circuit 12 as described above, so that the number of terminals can be reduced. Alternatively, exclusive output terminals may be provided.

Likewise, the input terminal for the analog input signal may be made to serve also as an input/output terminal for other signals.

Embodiment 2

Figure 4:
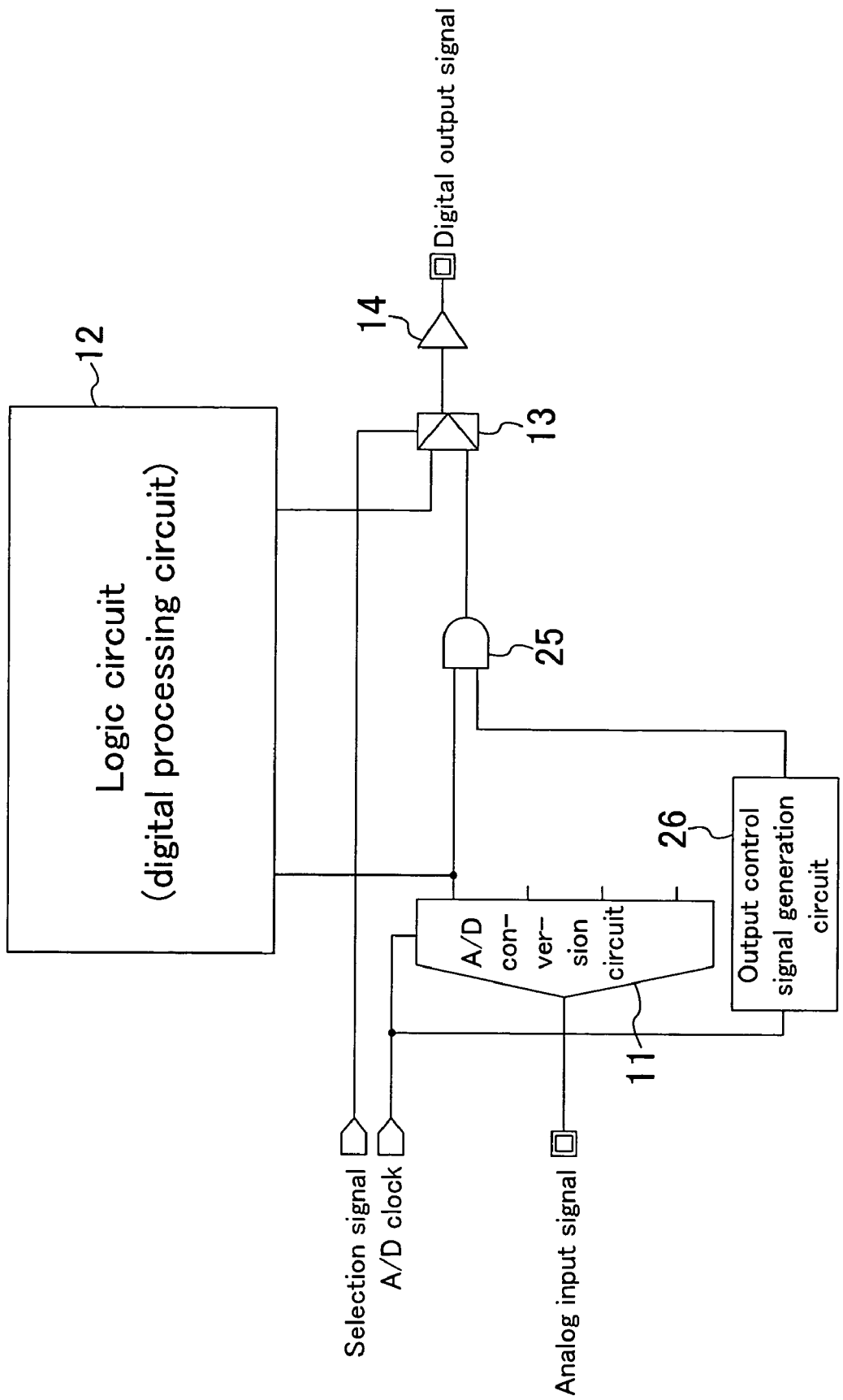
FIG. 4 is a circuit diagram showing a configuration of a main portion of a semiconductor device of Embodiment 2.
Figure 5:
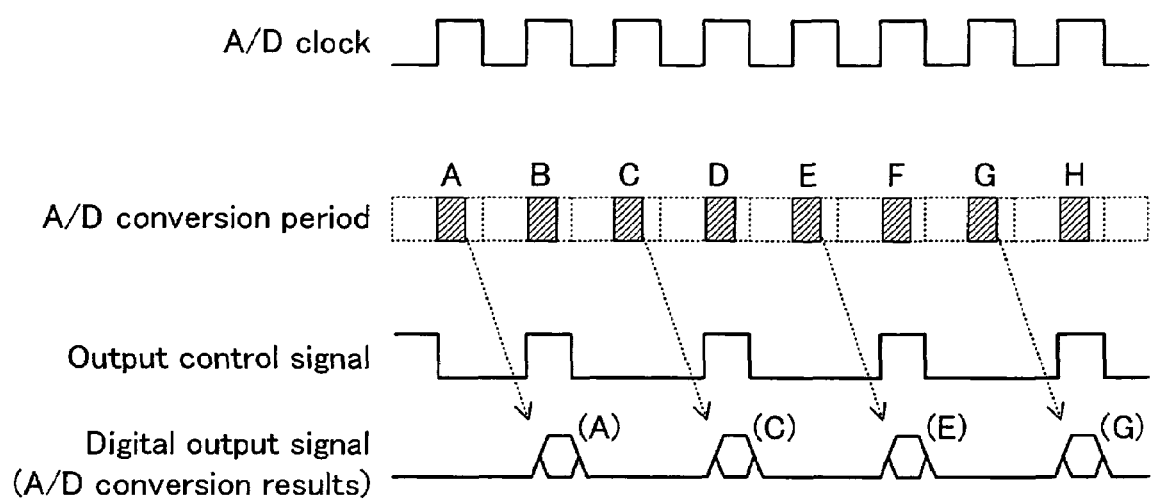
FIG. 5 is a timing chart showing the operation of the semiconductor device of Embodiment 2 during testing.

In the above embodiment, the conversion results of the A/D conversion circuit 11 were held in the flipflop 15 at predetermined timing. In this embodiment, as shown in FIG. 4, an AND circuit 25 and an output control signal generation circuit 26 are provided, to give timing, as shown in FIG. 5, with which the output of the conversion results (start, stop and their transient influential periods of the output) will not influence the precision of the A/D conversion. To state more specifically, the output control signal generation circuit 26 outputs an output control signal having every other clock pulse of the A/D clock or pulses synchronizing with the every other clock pulse. Thus, since the level of the signal outputted outside the semiconductor device is not changed during the periods other than those corresponding to the clock pulses of the output control signal, it is also possible in this embodiment to avoid influences of noise and the like at the timing at which conversion during the periods A, C, E and G is performed.

Embodiment 3

In Embodiments 1 and 2, the divide-by-2 clock and the output control signal were generated inside the semiconductor device. Such a clock and signal may otherwise be supplied from outside the semiconductor device (directly or indirectly) as shown in FIG. 6, for example. In this case, the output timing and frequency of the conversion results can be easily set according to the degree to which the output of the conversion results influences the conversion precision, the conversion precision that is to be checked in the testing, and the like, and this can increase the degree of freedom of the testing.

In the embodiments described above, the A/D conversion circuit 11 performed conversion every clock cycle of the A/D clock. A similar configuration can also be adopted for the case of performing one unit of A/D conversion every plurality of clock cycles. For example, assume that a pipeline type A/D conversion circuit having ten stages performs one unit of A/D conversion operation in 5.5 clock cycles and the respective stages operate in parallel with one another to output conversion results every clock cycle. In this case, the A/D clock may be frequency-divided by six at least for control of the output timing of the conversion results. That is, conversion results of conversion at any given stages performed in a clock cycle in which the conversion results are output may possibly have been influenced by noise and the like. However, the conversion results of conversion at all of the ten stages performed in the subsequent six clock cycles during the period over which the output operation is suppressed can be outputted in the sixth clock cycle. In other words, high-precision conversion results can be easily obtained by arranging the conversion results to be outputted every six or more clock cycles.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor device comprising:
   an A/D conversion circuit;
   a digital processing circuit for performing processing based on conversion results of the A/D conversion circuit; and
   an output terminal for testing for outputting the conversion results of the A/D conversion circuit externally,
   wherein the output of the conversion results from the output terminal for testing is made at timing that is different from timing of other conversion operation of which conversion results are to be outputted later and is longer in cycle than timing of conversion operation.

2. The device of claim 1, further comprising an output signal switch circuit, wherein the output terminal for testing is also used as an output terminal for normal operation from which a predetermined signal is output during normal operation.

3. The device of claim 1, further comprising a buffer circuit for a digital signal, wherein the conversion results of the A/D conversion circuit are outputted to the output terminal for testing via the buffer circuit.

4. The device of claim 1, further comprising an output control circuit for controlling the output timing of the conversion results to the output terminal for testing,
   wherein the other conversion operation of which conversion results are to be outputted later is performed in a clock cycle that does not include timing at which an output of the output control circuit changes.

5. The device of claim 4, wherein the output control circuit has a hold circuit for holding the conversion results of the A/D conversion circuit and outputting the held conversion results,
   wherein the other conversion operation of which conversion results are to be outputted later is performed in a clock cycle different from a clock cycle in which the hold circuit performs hold operation and a signal at the output terminal for testing changes.

6. The device of claim 4, wherein the output control circuit has a gate circuit for allowing or blocking passing of the conversion results of the A/D conversion circuit,
   wherein the other conversion operation of which conversion results are to be outputted later is performed in a clock cycle different from a clock cycle in which the gate circuit allows or blocks passing of the conversion results.

7. The device of claim 4, wherein the output control circuit controls the output timing of the conversion results according to a frequency-divided clock signal obtained by frequency-dividing an operation clock signal for the A/D conversion circuit or a delay signal of the operation clock signal, or a frequency-divided clock signal obtained by delaying the signal obtained by frequency-dividing the operation clock signal.

8. The device of claim 4, wherein the output control circuit controls the output timing of the conversion results according to a clock signal including part of clock pulses of an operation clock signal for the A/D conversion circuit or pulses synchronizing with the part of clock pulses.

9. The device of claim 1, wherein the A/D conversion circuit performs one unit of conversion operation every plurality of clock cycles.

10. The device of claim 9, wherein the A/D conversion circuit is a pipeline type A/D conversion circuit.

11. The device of claim 9, further comprising an output control circuit for controlling the output timing of the conversion results to the output terminal for testing,
    wherein the output control circuit controls the output timing of the conversion results according to a frequency-divided clock signal obtained by frequency-dividing an operation clock signal for the A/D conversion circuit to have a cycle longer than the plurality of clock cycles, or a clock signal including part of clock pulses of the operation clock signal and having a cycle longer than the plurality of clock cycles.

12. The device of claim 1, wherein the A/D conversion circuit comprises:
    a sample-and-hold circuit for holding an input voltage; and
    a comparator circuit for comparing the held voltage with a predetermined reference voltage,
    wherein at least either timing at which the input voltage is held in the sample-and-hold circuit or timing at which comparison operation of the comparator circuit is completed is different from the output timing of the conversion results from the output terminal for testing.

13. A semiconductor device comprising:
    an A/D conversion circuit;
    a digital processing circuit for performing processing based on conversion results of the A/D conversion circuit; and
    an output terminal for testing for outputting the conversion results of the A/D conversion circuit externally,
    wherein output timing of the conversion results from the output terminal for testing is controlled according to a timing control signal input externally.

14. The device of claim 13, further comprising a hold circuit for holding an output of the A/D conversion circuit and outputting the held output to the output terminal for testing,
    wherein timing of the holding of the hold circuit is controlled according to the timing control signal.

15. The device of claim 13, further comprising a gate circuit for allowing or blocking passing of the conversion results of the A/D conversion circuit,
    wherein timing of allowing and blocking passing of the conversion results by the gate circuit is controlled according to the timing control signal.

16. A semiconductor device comprising:
    an A/D conversion circuit for performing A/D conversion every clock cycle of an operation clock signal;

a digital processing circuit for performing processing based on conversion results of the A/D conversion circuit; and an output terminal for testing for outputting the conversion results of the A/D conversion circuit externally, wherein the device further comprises an output suppression circuit for suppressing output of the conversion results to the output terminal for testing at predetermined timing.

17. The device of claim 16, wherein conversion results of conversion operation that is performed at timing at which output of conversion results of other conversion operation is suppressed are output to the output terminal for testing.

* * * * *